(12) United States Patent
Potratz et al.

(10) Patent No.: US 12,413,202 B2
(45) Date of Patent: Sep. 9, 2025

(54) SURFACE ACOUSTIC WAVE RESONATOR ARRANGEMENT

(71) Applicant: RF360 SINGAPORE PTE. LTD., Republic Plaza (SG)

(72) Inventors: Carsten Potratz, Munich (DE); Peter Selmeier, Maitenbeth (DE); Thomas Bauer, Munich (DE); Helmut Klamm, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 1007 days.

(21) Appl. No.: 17/441,187

(22) PCT Filed: Mar. 30, 2020

(86) PCT No.: PCT/EP2020/058991
§ 371 (c)(1),
(2) Date: Sep. 20, 2021

(87) PCT Pub. No.: WO2020/201226
PCT Pub. Date: Oct. 8, 2020

(65) Prior Publication Data
US 2022/0158611 A1 May 19, 2022

(30) Foreign Application Priority Data
Apr. 5, 2019 (DE) ...................... 10 2019 109 022.9

(51) Int. Cl.
*H03H 9/02* (2006.01)
*H03H 9/145* (2006.01)
(Continued)

(52) U.S. Cl.
CPC ........ *H03H 9/02834* (2013.01); *H03H 9/145* (2013.01); *H03H 9/25* (2013.01); *H03H 9/64* (2013.01); *H04B 1/40* (2013.01)

(58) Field of Classification Search
CPC ...... H03H 9/25; H03H 9/02574; H03H 9/145; H03H 9/02834; H03H 9/02653;
(Continued)

(56) References Cited

U.S. PATENT DOCUMENTS 4,210,883 A * 7/1980 Shah ................... H03H 9/02834
333/195
5,952,899 A 9/1999 Kadota et al.
(Continued)

FOREIGN PATENT DOCUMENTS

FR 2906421 A1 3/2008
JP 85287953 A 7/1977
(Continued)

OTHER PUBLICATIONS

International Search Report and Written Opinion—PCT/EP2020/058991—ISA/EPO—Jun. 23, 2020.
Wu P., et al., "Temperature Compensation of SAW in ZnO/SiO/sub 2//Si Structure," IEEE Ultrasonics Symposium Proceedings, vol. 1, 2001, pp. 211-214, XP010584511, section I, figure 1.

*Primary Examiner* — J. San Martin
(74) *Attorney, Agent, or Firm* — Polsinelli

(57) ABSTRACT

A surface acoustic wave resonator arrangement comprises a piezoelectric substrate (100) and a surface acoustic wave resonator (110) which includes an interdigital transducer (111,112) disposed on the piezoelectric substrate (100). A trench (130) is disposed within the piezoelectric substrate (100) facing the resonator (110). Trench (130) causes reflected waves (143,144) in response to waves (141,142) leaking from the surface acoustic wave resonator. Trench (130) is configured such that the reflected acoustic waves (143,144) achieve phases at the edge (115) of the resonator (110) such that the accumulated phases of all the reflected waves received at edge (115) is zero or substantially zero, thereby avoiding constructive interference of the reflected waves with the acoustic waves resonating in the resonator.

(Continued)

Thereby undesired acoustic coupling between resonators or influence of waves reflected at edges of the piezoelectric substrate or dicing lines is reduced.

15 Claims, 5 Drawing Sheets

(51) Int. Cl.
    *H03H 9/25*     (2006.01)
    *H03H 9/64*     (2006.01)
    *H04B 1/40*     (2015.01)

(58) Field of Classification Search
    CPC .. H03H 9/64; H03H 9/02622; H03H 9/02842; H03H 9/02866; H03H 9/02677; H03H 9/02905; H03H 9/02614; H03H 9/02629; H04B 1/40
See application file for complete search history.

(56) References Cited

U.S. PATENT DOCUMENTS

| | | |
|---|---|---|
| 2004/0222717 A1 | 11/2004 | Matsuda et al. |
| 2005/0200434 A1* | 9/2005 | Takano ................. H03H 3/08 333/193 |
| 2014/0009032 A1 | 1/2014 | Takahashi et al. |
| 2015/0155851 A1 | 6/2015 | Tsutsumi et al. |
| 2016/0049919 A1 | 2/2016 | Kuroyanagi et al. |
| 2019/0238114 A1* | 8/2019 | Kishimoto ............ H03H 9/145 |

FOREIGN PATENT DOCUMENTS

| | | | |
|---|---|---|---|
| JP | 2000068781 A | * 3/2000 | |
| JP | 2000106519 A | 4/2000 | |
| JP | 3341704 B2 | * 11/2002 | ............... H03H 9/25 |

* cited by examiner

SURFACE ACOUSTIC WAVE RESONATOR ARRANGEMENT

TECHNICAL FIELD

The present disclosure relates to a surface acoustic wave resonator arrangement. Specifically, the present disclosure relates to a surface acoustic wave resonator arrangement that comprises a piezoelectric substrate and at least one surface acoustic wave resonator that includes an interdigital transducer which is disposed on the piezoelectric substrate.

BACKGROUND

Electro-acoustic resonators such as surface acoustic wave (SAW) resonators are widely used in electronic devices to perform a frequency-selective function in a RF filter, an oscillator and the like. A SAW resonator comprises a piezoelectric substrate which may be a thin-film piezoelectric substrate including a carrier substrate on which the thin piezoelectric layer is disposed. Other layers may be disposed between the thin piezoelectric layer and the carrier substrate. Other types of SAW resonators may comprise a bulk piezoelectric layer.

An interdigital transducer (IDT) is disposed on the top surface of the piezoelectric layer. The IDT comprises a first and a second electrode including a plurality of fingers in interdigitated arrangement so that one finger of the first electrode is located between two other neighboring fingers of the second electrode. By application of an electrical RF signal to the electrodes, an acoustic resonating wave is generated within the piezoelectric substrate having a frequency-selective effect on the electrical RF signal.

Several SAW resonators may be connected with each other in series and shunt paths to form a RF filter such as a ladder-type filter. The RF filter has a passband to filter a wanted signal from the received spectrum or shape a signal for transmission. The passband portion of the filter characteristic should have an as low as possible insertion loss and the stop band region of the filter should have an as high as possible attenuation to suppress the unwanted portions of the spectrum.

A resonator is manufactured using a piezoelectric wafer so that an arrangement of several SAW resonators forming a RF filter are, in most cases, disposed on the same piezoelectric chip or die. During operation of the SAW resonators, a small portion of the acoustic waves within the piezoelectric substrate and a small portion of the electromagnetic waves at the IDTs may propagate beyond the area of the SAW resonator and couple into neighboring resonators that are disposed in the vicinity of each other. Furthermore, individual chips are separated from each other in a dicing process so that an acoustic wave leaking from one of the SAW resonators may be reflected at the dicing line and arrives back at the resonator which may lead to a constructive interference with the resonating waves so that the operation of the SAW resonator may be affected.

It is desirable to reduce or avoid the effect of electro-acoustic energy leaking from a resonator.

It is an object of the present disclosure to provide a surface acoustic wave resonator arrangement that reduces or avoids parasitic electromagnetic and acoustical interaction between two or more resonators.

It is an another object of the present disclosure to provide a surface acoustic wave resonator arrangement that reduces or avoids the effect of an acoustic wave reflected at the dicing line.

It is yet another object of the present disclosure to increase selectivity and insertion loss of RF filters.

SUMMARY

One or more of the above-mentioned objects are achieved by a surface acoustic wave resonator arrangement according to the features of present claim 1.

A surface acoustic wave resonator arrangement according to the principles of the present disclosure comprises a piezoelectric substrate made of a piezoelectric material such as quartz, lithium tantalate or lithium niobate. Other piezoelectric materials are also useful. A surface acoustic wave resonator includes an interdigital transducer that is disposed on the piezoelectric substrate. The interdigital transducer may comprise a first and a second electrode made of metal or a stack of metal layers. The metal material of the interdigital transducer may include metals selected from aluminum, copper, chromium, titanium and tungsten. Other metals are also useful. The resonator may be included in a RF filter. The resonator may be included in or may be portion of an arrangement of longitudinally coupled resonators such as a dual mode structure (DMS).

A trench is disposed within the piezoelectric substrate. The trench faces the surface acoustic wave resonator. Specifically, the trench faces the interdigital transducer of the resonator. The trench within the piezoelectric substrate serves to reflect an acoustic wave that escapes from an end of the resonator through the piezoelectric material back to the resonator from where it originates. The trench avoids that the acoustic wave leaking from the resonator propagates beyond the trench further through the piezoelectric substrate and avoids that the acoustic wave reaches another resonator where it may distort its operation. Furthermore, the trench avoids that the acoustic wave leaking from the resonator propagates beyond the trench further through the piezoelectric substrate and reaches another feature on the chip such as a dicing line where it is reflected in uncontrolled manner. The trench reflects the leaking acoustic wave back to the resonator in a controlled manner such that distortion of the acoustic performance in the resonator from where the acoustic leaks is reduced or substantially avoided.

According to embodiments, the trench within the piezoelectric substrate extends opposite an edge of the surface acoustic wave resonator or opposite an edge of the interdigital transducer of the resonator. The surface acoustic wave resonator or its interdigital transducer may have a linear, straight edge, and the trench extends in a direction that is opposite that edge. The edge of the surface acoustic wave resonator may be the end of the acoustic track of the resonator. The edge may extend in a direction perpendicular to the extension direction of the acoustic track of the resonator. The acoustic track of the resonator includes the interdigital transducer with interdigitated fingers and may further include acoustic reflectors adjacent to the interdigital transducer. The edge of the interdigital transducer may be formed by the outmost finger of one of the electrodes of the interdigital transducer.

According to embodiments, the trench may be configured such that reflection of the acoustic wave leaking from the resonator is performed in a controlled manner. The trench may be configured to reflect the acoustic waves exiting from the edge of the surface acoustic wave resonator back to it in such a manner that the phases of the reflected wave arriving at the edge of the surface acoustic wave resonator, after their reflection at the trench, are such that the accumulated phases at the edge of the surface acoustic wave resonator are zero or substantially zero. In this case, the reflected waves at the edge of the surface acoustic wave resonator do not constructively interfere with the acoustic waves operating within the resonator.

The trench may be configured such that it extends as a straight trench or that it extends in curved non-linear shape to fulfil the requirement that the accumulated phases of the reflected wave at the edge of the surface acoustic wave resonator are zero or substantially zero.

According to embodiments, the trench may be disposed at a distance from the edge of the surface acoustic wave resonator. The distance may vary along the length of extension of the trench. The trench may have a linear, straight extension along a straight line having a maximum distance and a minimum distance taken from the edge of the surface acoustic wave resonator. The difference between maximum and minimum distances is at least $\frac{1}{2}\lambda$, wherein $\lambda$ is the wavelength of an operating frequency of the surface acoustic wave resonator such as the resonance frequency or a frequency close to the resonance frequency of the resonator.

According to embodiments, the term $\lambda$ is two times the pitch of the interdigitated fingers of the interdigital transducer of the surface acoustic wave resonator. The pitch is taken from one of the fingers of the resonator to the next neighboring finger. The pitch may be taken from one feature of one of the fingers to the corresponding feature of the neighboring finger. The pitch represents the repetitive distance between neighboring fingers, wherein one finger may belong to one of the electrodes of the interdigital transducer and the other finger belongs to the other electrode of the interdigital transducer.

According to embodiments, the trench may comprise one or more portions wherein each trench portion extends along a direction that forms an angle with the edge of the surface acoustic wave resonator. The angle between one of the trench portions and the edge of the surface acoustic wave resonator may be from close to 0° up to 20°. Specifically, concatenated trench portions may have a different direction from each other so that the angle between one of the trench portions and the edge of the surface acoustic wave resonator changes from portion to portion. The angles of concatenated trench portions are different from each other.

According to embodiments, the trench is disposed between the mentioned surface acoustic wave resonator and another surface acoustic wave resonator. Accordingly, the trench separates the area between at least two surface acoustic wave resonators so that an acoustic wave leaking from one of the resonators is reflected at the trench back to that resonator so that it does not reach and distort the operation of the other resonator.

According to embodiments, the piezoelectric layer may be disposed on a carrier substrate. The carrier substrate may be a sapphire wafer or a silicon wafer such as a lightly doped crystalline silicon wafer. Other materials that are suitable to carry a piezoelectric layer may also be useful. The carrier substrate may be a portion of a larger wafer used during manufacturing of the surface acoustic wave resonator arrangement which is diced into individual chips during the manufacturing process. According to embodiments, a dicing line which causes an edge of the carrier substrate may be disposed within the trench so that the edge of the carrier substrate may be disposed underneath the trench at the trench bottom surface. In this case, the sidewall of the trench reflects the acoustic waves leaking from the surface acoustic wave resonator at the trench sidewall, wherein the trench generates a phase relation of the reflected acoustic waves at the surface acoustic wave resonator that reduces distortion.

According to embodiments, the trench can be disposed inbetween the edge of the surface acoustic wave resonator and an edge of the carrier substrate obtained by dicing so that the trench can be suitably designed to achieve a defined distribution of phases of the reflected wave at the edge of the surface acoustic wave resonator.

According to embodiments, the layered or stacked substrate may comprise a carrier substrate and a dielectric temperature compensation layer disposed on the carrier substrate. The piezoelectric layer is disposed on the temperature compensation layer so that the temperature compensation layer is disposed between the carrier substrate and the piezoelectric layer. The temperature compensation layer has a different temperature coefficient than the piezoelectric layer. For example, the temperature compensation layer may be a dielectric layer such as a silicon dioxide layer or doped silicon dioxide layer which has a temperature coefficient of frequency which is different and opposite to the temperature coefficient of frequency of the piezoelectric layer, thereby providing temperature compensation. The material of the piezoelectric layer is removed within the trench to such an extent that the temperature compensation layer is exposed within the trench. It is also possible to remove parts or all of the temperature compensation layer within the trench.

Other piezoelectric substrates are also useful such as bulk piezoelectric substrates. In this case, the trench should have a sufficient depth within the bulk piezoelectric layer that it reflects the acoustic waves leaking from the neighboring surface acoustic wave resonator according to the principles discussed above.

According to embodiments, the surface acoustic wave resonator arrangement may comprise a first plurality of surface acoustic wave resonators and a second plurality of surface acoustic wave resonators, wherein the first and second pluralities of surface acoustic wave resonators each form a respective RF filter. The trench is disposed between the resonators of the different RF filters thereby achieving acoustic separation and avoiding acoustic crosstalk between the resonators of the first and the second RF filters.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF THE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
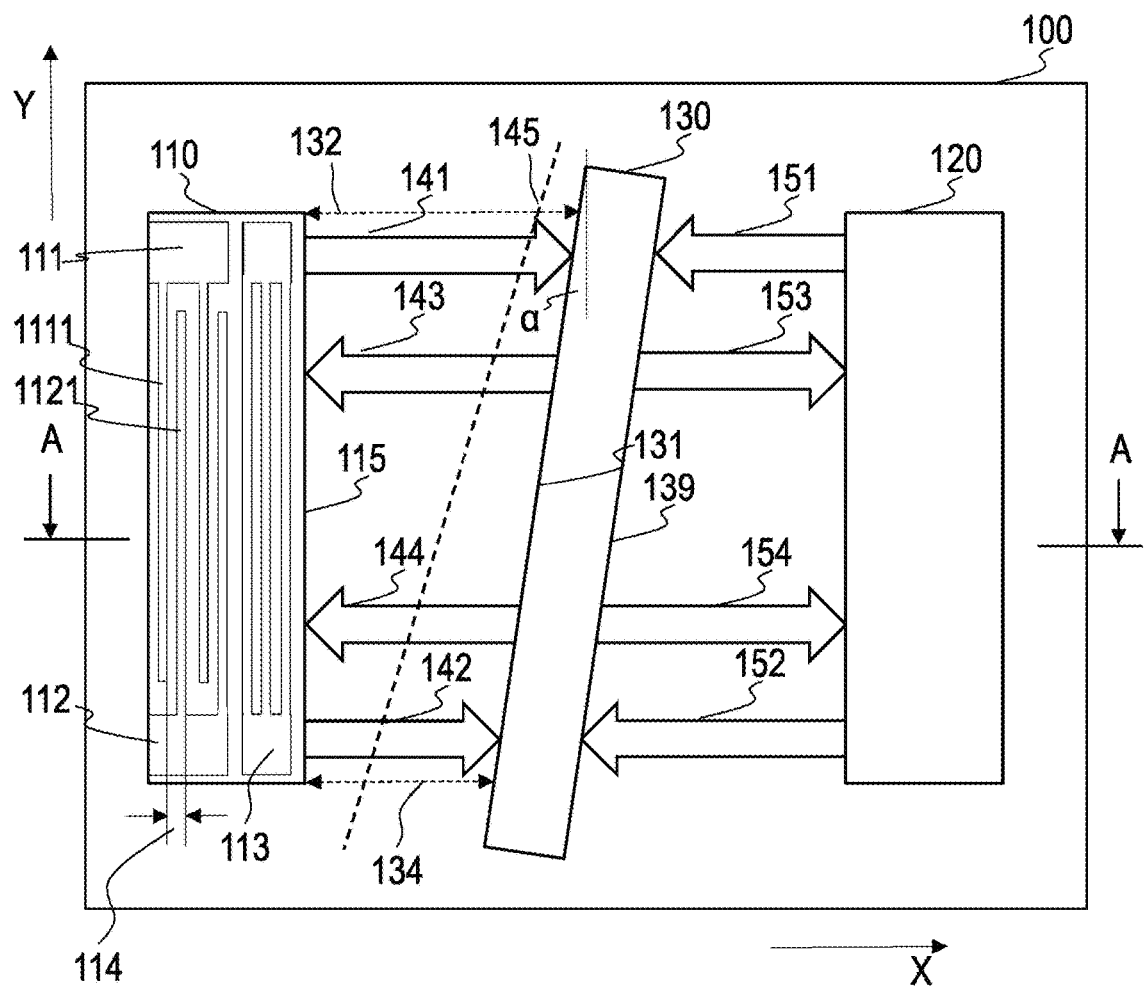
FIG. 1 shows a top view onto a micro-acoustic chip having two resonators and a trench disposed therebetween.

FIG. 1 depicts a top view on a portion of a piezoelectric chip 100. The piezoelectric substrate layer 100 includes a first and a second surface acoustic wave resonator 110, 120. Resonator 110 includes an interdigital transducer (IDT) 111, 112 which is partially depicted. The resonator 110 and the interdigital transducer 111, 112 have a longitudinal extension in direction X of which only a portion is shown for simplicity reasons. By the application of a RF signal to the IDT 111, 112 an acoustic resonating wave is generated within the acoustic track. The acoustic track extends in direction X. The acoustic wave is established within the piezoelectric material disposed underneath the IDT 111, 112. The IDT 111, 112 includes a first electrode in and a second electrode 112, each having a plurality of, for example, several hundreds of fingers 1111, 1121 disposed in interdigitated manner. A reflector 113 is disposed at the end of the acoustic track and adjacent to IDT 111, 112 to confine the acoustic energy within the resonator area. The resonator 110 includes a right-hand edge or end 115 which extends in the direction Y perpendicular to the direction X of the acoustic track. A small amount of acoustic energy, however, such as acoustic waves 141, 142 propagate beyond end 115 and beyond reflector 113 and leak from the acoustic track of resonator 110 through the piezoelectric substrate 100. Resonator 120 has a corresponding structure and corresponding effects of leaking. Resonator 110 or resonator 120 may be included in a corresponding RF filter. Resonator 110 or resonator 120 may be included in or may be portion of a corresponding arrangement of longitudinally coupled resonators such as a dual mode structure (DMS). In the dual mode structure, two or more resonators are arranged along an acoustic track so that they are longitudinally coupled.

A trench 130 is provided within the piezoelectric substrate chip 100 which faces along the length of the edge 115 of resonator 110 and extends opposite to resonator edge 115. A sidewall 131 of trench 130 reflects the acoustic waves 141, 142 leaking from resonator 110 as waves 143, 144 thereby propagating back to the edge 115. Trench 130 prevents waves 141, 142 from reaching the neighboring resonator 120 so that acoustic crosstalk between neighboring resonators 110, 120 is avoided. Trench 130 is slightly slanted against direction Y. The angle between trench 130 and edge 115 is α. Angle α may be in a range between 0 degrees (°) and 20 degrees (°). Specifically, angle α may be selected such that a plane of constant phase of the reflected waves is formed at 145. The plane 145 is not parallel to edge 115 and forms another angle with edge 115 such that waves 143, 144 arriving back at edge 115 of resonator 110 avoid a constructive interference with the waves resonating within the resonator 110. The angle α may be taken between the trench sidewall 131 and the edge 115 of the resonator. The angle α may also be taken between the edge of the IDT 111, 112 given by the outermost finger of the IDT which extend along direction Y and the trench sidewall 131.

It is useful to configure the trench 130 such that the reflected acoustic waves 143, 144 achieve phases at the edge 115 such that the accumulated phases of all the reflected waves received at edge 115 is zero or substantially zero, thereby avoiding constructive interference of the reflected waves with the acoustic waves resonating in the resonator.

Trench 130 may be a straight trench having a linear extension having a maximum distance 132 between the edge 115 and sidewall 131 of trench 130 and a minimum distance 134 between edge 115 and sidewall 131. The difference between maximum and minimum distances 132, 134 should be at least one half of the wavelength λ of an operating frequency of the surface acoustic wave resonator 110. The wavelength λ depends on the pitch 144 of the interdigitated fingers of the IDT 111, 112. The pitch is given between, for example, the right-hand edges of IDT fingers 1111, 1121. Specifically, the wavelength λ is two times that pitch. In this case, the accumulated phases at edge 115 of reflected waves 143, 144 is substantially zero.

A similar situation applies to resonator 120 wherein waves 151, 152 exiting from the acoustic track of resonator 120 are reflected at the sidewall 139 of trench 130 resulting in reflected waves 153, 154. The angle of inclination α between the extension of trench 130 relative to the edge 115 of resonator 120 causes an accumulated phase of the reflected waves 153, 154 at the resonator 120 substantially zero avoiding constructive interference with the operational waves within resonator 120. Resonator 110 may be part of a first filter and resonator 120 may be part of another filter. Both filters may be included in a duplexer so that they perform different filter functions such as receive and transmit functions, resp.

The trench shown in FIG. 1 has the same width along its lengthwise extension, wherein sidewalls 131, 139 extend parallel to each other. It is also possible to use a trench having a width that varies over the length of the trench. For example, the width may increase constantly along the length of the trench so that the trench sidewalls may enclose an angle different from zero with each other. In this case the angle of the sidewall facing resonator 110 is different from the angle of the sidewall facing resonator 120 so that the orientation or the angle of the trench sidewall enclosed with the adjacent resonator edge may be adapted to different operating frequencies of these resonators.

Figure 2:
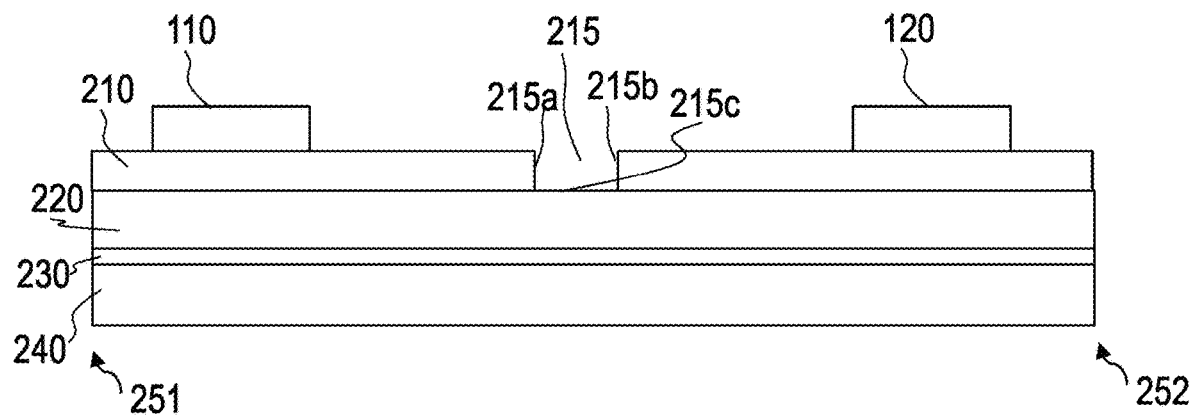
FIG. 2 shows a cross-sectional view of the chip of FIG. 1 along line A-A.

FIG. 2 shows a cross-section through the chip 100 of FIG. 1 along line A-A. The structure of the substrate 100 is shown in more detail. A bottom-most carrier substrate 240 is made of crystalline doped silicon or of sapphire or of another carrier substrate material. A charge-trapping layer 230 such as a polysilicon layer is disposed on carrier substrate layer 240. A temperature compensation layer 220 is disposed on charge-trapping layer 230. The temperature compensation layer 220 may be made of silicon dioxide or doped silicon dioxide or another material suitable for temperature compensation. Disposed thereon is a piezoelectric layer 210 which may be made of quartz, lithium tantalate, lithium niobate or another suitable piezoelectric material. Trench 215 is inserted within the piezoelectric layer 210, wherein the trench comprises sidewalls 215a, 215b extending into the piezoelectric layer. The bottom surface 215c of trench 215 exposes the temperature compensation layer 220 such as a silicon dioxide. Trench 215 may be etched with a dry or a wet etching process known to the skilled artisan into the piezoelectric layer removing the material 210 from the piezoelectric layer relative to a mask (not shown). The etching process may stop when the temperature compensation layer 220 is reached thereby forming bottom surface 215c of the trench. It is also possible to remove the temperature compensation layer 220 partially or fully within the trench 215. The sidewalls 215a, 215b may be perpendicular to the top and/or bottom surfaces of the piezoelectric layer 210 or may be slanted and may enclose an angle different from 90° with the top surface of the piezoelectric layer 220. The left and the right ends or edges 251, 252 of the portion of substrate shown in FIG. 2 may be obtained by a dicing process which separates the shown chip from a larger wafer used during the manufacturing of the resonator arrangement.

Figure 3:
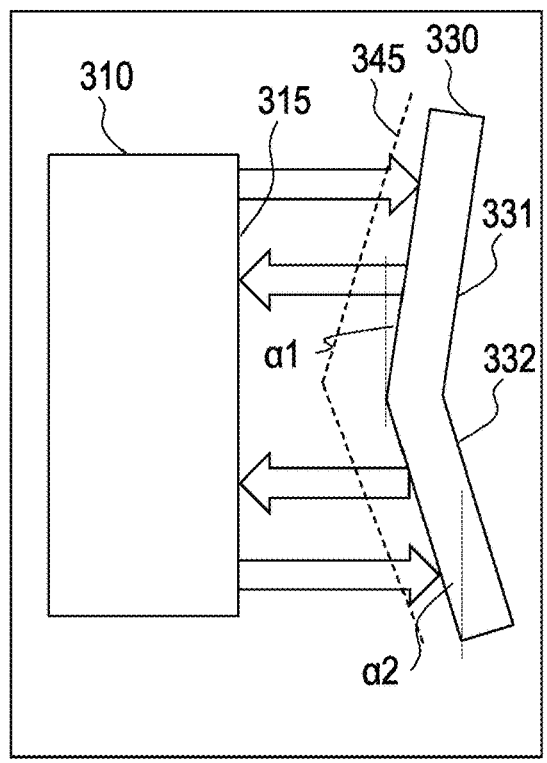
FIG. 3 shows a top view onto a micro-acoustic chip having a surface acoustic wave resonator and a trench according to one embodiment.

FIG. 3 shows another embodiment of the trench 330. Trench 330 comprises two portions 331, 332 having different orientation relative to the edge 315 of resonator 310. The upper portion 331 encloses an angle α1 with the edge 315 which is the vertical direction depicted in FIG. 3. Portion 332 encloses another angle α2 with the edge direction 315. Angles α1, α2 are different from each other. The dashed line 345 depicts the plane of constant phase of the waves reflected at the sidewalls of the trench portions 331, 332.

Figure 4:
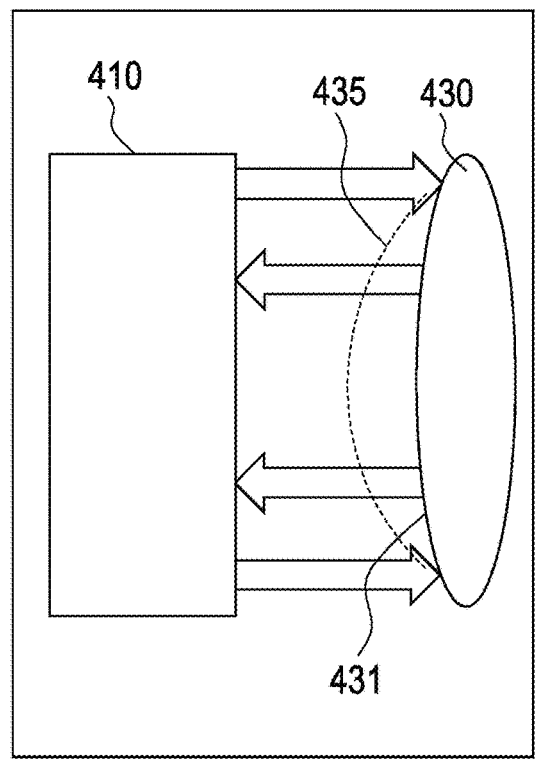
FIG. 4 shows a top view onto a micro-acoustic chip having a surface acoustic wave resonator and a trench according to another embodiment.

FIG. 4 shows yet another embodiment of a trench 430 disposed in the vicinity of resonator 410. Edge 430 has a curved sidewall 431. Trench 430 has an elliptical shape. The waves reflected by the sidewall 431 of trench 430 exhibit a plane 435 of constant phase of the reflected waves.

Figure 5:
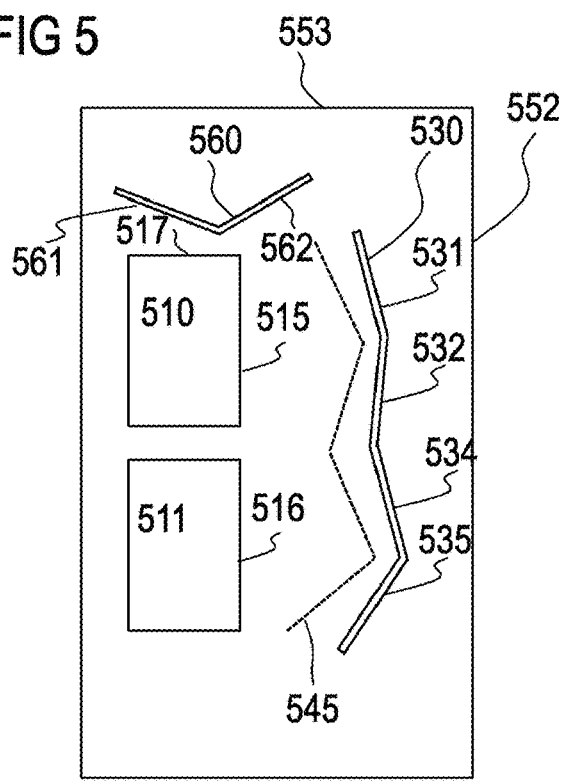
FIG. 5 shows a top view onto a micro-acoustic chip having a trench disposed between surface acoustic wave resonators and an edge of the micro-acoustic chip.

FIG. 5 shows a top view on yet another embodiment. The piezoelectric chip depicted in FIG. 5 includes two resonators 510, 511. A trench 530 comprising a number of four different trench sections is disposed between resonators 510, 511 and dicing edge 552 of the piezoelectric chip. Specifically, trench 530 comprises a first portion 531, a second portion 532, a third portion 534 and a fourth portion 535 concatenated with each other. Each two concatenated portions such as 531 and 532 etc. have a different orientation and enclose a different angle with the edges 515, 516 of the resonators 510, 511. With trench 530 disposed between resonators 510, 511 and dicing edge 552, the waves leaking from resonators 510, 511 are prevented from reaching dicing edge 552 in that they are reflected at the sidewall of trench 530 back to the resonators 510, 511. Accordingly, resonators 510, 511 are decoupled from dicing edge 552. The dashed line 545 represents the plane of constant phase of the waves reflected from trench 530.

In a similar way, trench 560 comprising two portions 561, 562 of different orientation and different angles relative to horizontal edge 517 of resonator 510 is disposed between resonator 510 and the horizontal dicing edge 553. Trench 560 reflects the wave exiting from the horizontal edge 517 of resonator 510 back to the resonator 510, thereby avoiding a constructive interference with the waves operating in resonator 510.

Figure 6:
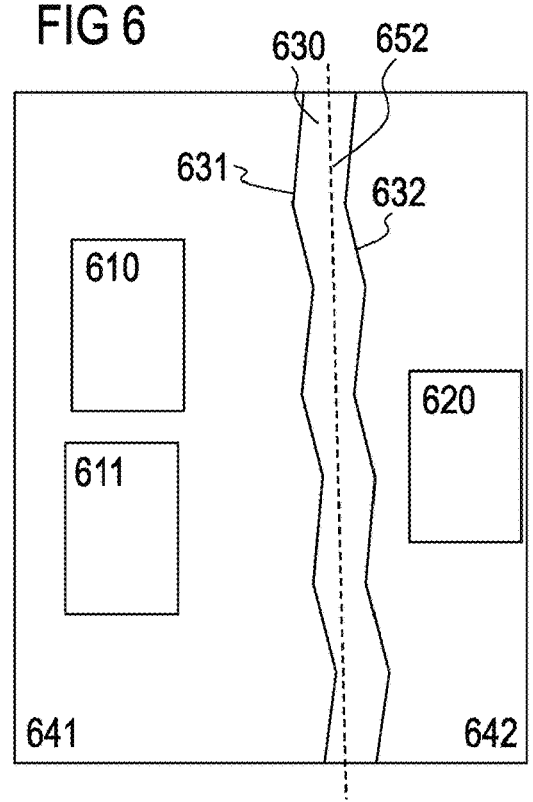
FIG. 6 shows a portion of a micro-acoustic chip having a trench intended to include a dicing line.

FIG. 6 depicts yet another embodiment showing two die portions 641, 642 which are to be separated along projected dicing line 652. The dicing line 652 is included within trench 630 which faces the edges of resonators 610, 611 on die 641 and faces the edge of resonator 620 disposed on die 642. The trench 630 has sufficient width so that the straight dicing line 652 can be applied at the bottom of the trench 630. During dicing when the dicing line is applied the portions 641, 642 of the chip are separated from each other and an edge of the chips is obtained at dicing line 652. The sidewall 631 of trench 630 disposed opposite resonators 610, 611 is composed of several straight portions, each having a different orientation relative to the edges of resonators 610, 611. The sidewall 631 serves to reflect the acoustic waves leaking from resonators 610, 611 back to the resonators in a controlled manner so that the reflected waves do not interfere constructively with the waves operating in resonators 610, 611. Specifically, the edge 631 of trench 630 has multiple sections with different orientation that are not parallel to the edges of resonators 610, 611. A corresponding situation applies to the other edge 632 of trench 630 facing resonator 620.

Figure 7:
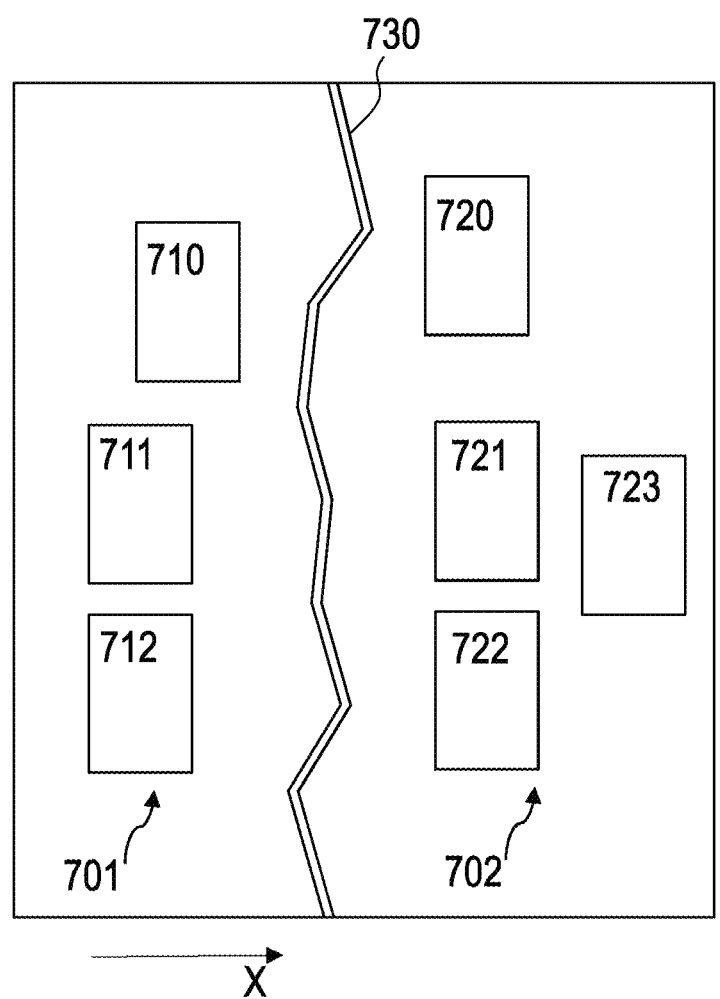
FIG. 7 shows a portion of a micro-acoustic chip including surface acoustic wave resonators of different RF filters.

FIG. 7 depicts yet another embodiment including two RF filters 701, 702, each comprising a plurality of surface acoustic wave resonators such as resonators 710, 711, 712 forming RF filter 701 and resonators 720, 721, 722, 723 forming RF filter 702. Filters 701, 702 exhibit different filter characteristics and perform different filter functions. For example, filter 701 may be a receive filter and filter 702 may be a transmit filter, both included in a duplexer that may be included in a RF front-end of a communication device. Although three resonators are depicted for filter 701 and four resonators are depicted for filter 702, more or less than three and four resonators may be included in the filters, resp., depending on the filter specification to be achieved. The resonators are connected with each other in such a way that a filter function performing a frequency selective operation with respect to an electrical signal is achieved. For example, the resonators may be connected in a ladder-type structure that includes a serial path of resonators arranged between at least two input/output ports and one or more shunt paths connected between terminals of the serial resonators and ground potential.

A trench 730 is disposed between the resonators of the two RF filters 701, 702 separating the resonators of filter 701 from the resonators of filter 702. Trench 730 serves to decouple the acoustic crosstalk between the resonators from filters 701, 702. Specifically, an acoustic wave leaking from any of resonators 710, 711, 712 propagating in direction X to filter 702 is reflected at trench 730 back to the respective resonators. Trench 730 is composed of a multitude of straight trench sections wherein concatenated sections have a different angle relative to the edges of the resonators so that the waves reflected at trench 730 back to the resonators 710, 711, 712 have a phase relation which avoids constructive interference within said resonators. The same situation applies to resonators 720, . . . , 723 so that an acoustic wave leaking from any of resonators 720, . . . , 723 propagating in direction −X to filter 701 is reflected at trench 730 back to the respective resonators.

Figure 8:
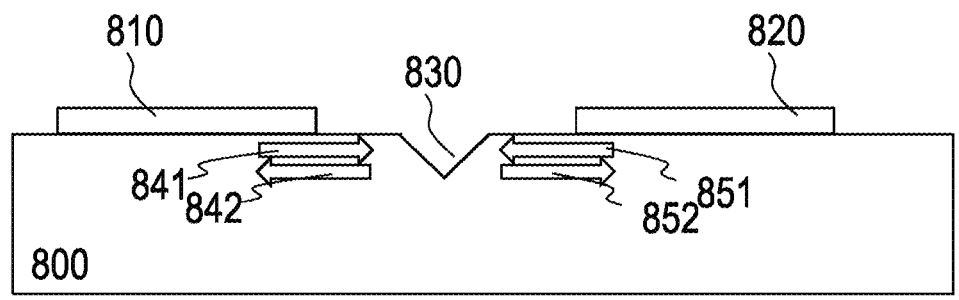
FIG. 8 shows a cross-sectional view onto a micro-acoustic chip having a bulk substrate including a trench.

FIG. 8 depicts yet another embodiment which illustrates a cross-sectional view through a bulk piezoelectric substrate 800 on which two surface acoustic wave resonators 810, 820 are disposed. A trench 830 is disposed within bulk piezoelectric substrate 800. Trench 830 is disposed between resonators or corresponding IDTs 810, 820 to avoid propagation of waves exiting from one of the resonators 810, 820 to the other resonator 820, 810, respectively. Trench 830 should have a sufficient depth within bulk substrate 800 so that wave 841 leaking from resonator 810 is reflected as wave 842 back to resonator 810. In the same way, trench 830 serves to reflect wave 851 leaking from resonator 820 as wave 852 back to resonator 820. With the introduction of trench 830 into bulk piezoelectric substrate 800, acoustic interaction between surface acoustic wave resonators 810, 820 can be substantially avoided.

Figure 9:
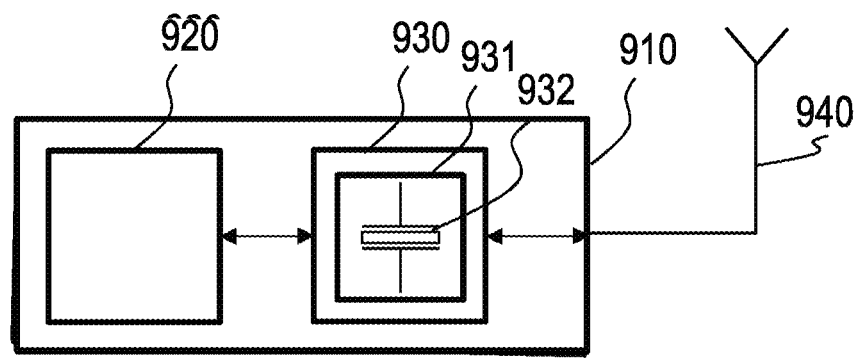
FIG. 9 shows a block diagram of a communication device including a RF front-end unit including a micro-acoustic chip.

FIG. 9 shows a block diagram of a communication device such as a cell phone, a mobile phone, a smartphone or a communication unit in an internet enabled physical device in an IoT (Internet of Things) environment. The communication device may be configured to perform communication according to 4G or 5G communication standards. The communication device 910 of FIG. 9 includes a signal processing unit 920 which performs digital signal processing of data to be transmitted or to be received to/from another device through an air interface over an antenna 940. A RF front-end unit 930 is coupled between the digital signal processing unit 920 and the antenna 940 and performs shaping of a RF signal including to be transmitted data or selection of a RF signal from the received signal spectrum. The RF front-end unit 930 includes one or more RF filters 931, for example, a duplexer filter arrangement. The RF filter(s) include(s) a resonator arrangement 932 as discussed above that includes at least one resonator and a trench in vicinity to each other to avoid distorting effects of acoustic waves leaking from the resonator as explained above.

Figure 10:
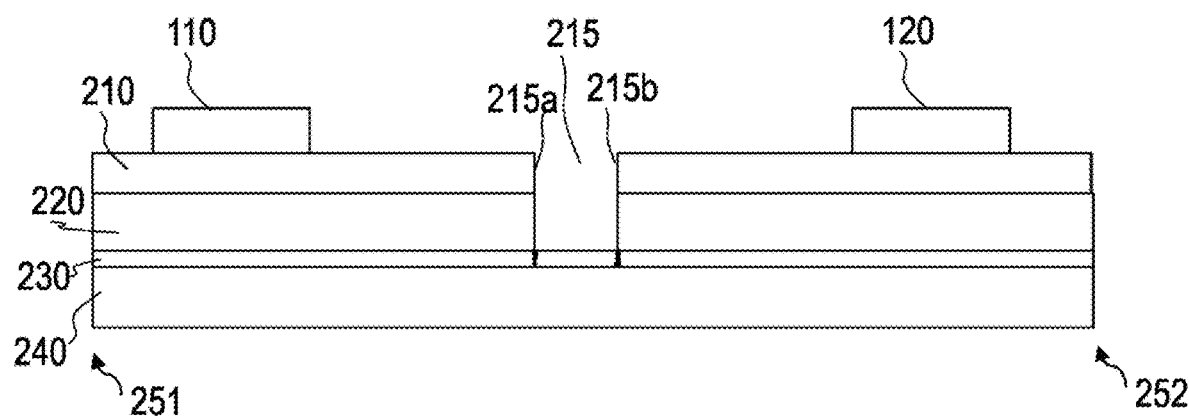
FIG. 10 shows another block diagram of a communication device including a RF front-end unit including a micro-acoustic chip.

FIG. 10 shows a cross-section through another chip 100 of FIG. 1 along line A-A. In FIG. 10, the piezoelectric substrate and the dielectric temperature compensation layer are removed within the trench.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

The invention claimed is:

1. A surface acoustic wave resonator arrangement, comprising:
   a piezoelectric substrate;
   a first surface acoustic wave resonator including an interdigital transducer disposed on the piezoelectric substrate;
   a second acoustic wave resonator laterally adjacent to the first surface acoustic wave resonator; and
   a single trench disposed within the piezoelectric substrate between the first surface acoustic wave resonator and the second acoustic wave resonator, the single trench facing the first surface acoustic wave resonator and slanted with respect to an edge of the first surface acoustic wave resonator,
   wherein the single trench comprises one or more trench portions, each trench portion extending along a direction that forms angles ($\alpha 1$, $\alpha 2$) with the edge of the first surface acoustic wave resonator.

2. The surface acoustic wave resonator arrangement according to claim 1, wherein the single trench extends opposite the edge of the first surface acoustic wave resonator.

3. The surface acoustic wave resonator arrangement according to claim 1, wherein the trench extends opposite the edge of the interdigital transducer of the first surface acoustic wave resonator.

4. The surface acoustic wave resonator arrangement according to claim 1, wherein the single trench is configured to reflect acoustic waves that traversed past the edge of the first surface acoustic wave resonator back to the first surface acoustic wave resonator and configured to achieve phases of the reflected acoustic waves at the edge of the first surface acoustic wave resonator such that accumulated phases at the edge of the first surface acoustic wave resonator are zero or substantially zero.

5. The surface acoustic wave resonator arrangement according to claim 1, wherein the single trench disposed at a distance from an edge of the first surface acoustic wave resonator, the single trench having a maximum distance and a minimum distance to the edge of the first surface acoustic wave resonator, a difference between maximum and minimum distances being at least ½$\lambda$, wherein $\lambda$ is a wavelength of an operating frequency of the first surface acoustic wave resonator.

6. The surface acoustic wave resonator arrangement according to claim 5, wherein $\lambda$ is two times of a pitch of interdigitated fingers of the interdigital transducer of the first surface acoustic wave resonator.

7. The surface acoustic wave resonator arrangement according to claim 1, wherein the angles ($\alpha 1$, $\alpha 2$) of concatenated trench portions are different from each other.

8. The surface acoustic wave resonator arrangement according to claim 1, wherein the piezoelectric substrate is disposed on a carrier substrate, the carrier substrate having an edge, wherein the edge of the carrier substrate is disposed underneath the single trench.

9. The surface acoustic wave resonator arrangement according to claim 1, wherein the piezoelectric substrate is disposed on a carrier substrate the carrier substrate having an edge, wherein the single trench is disposed between the edge of the carrier substrate and the edge of the first surface acoustic wave resonator.

10. The surface acoustic wave resonator arrangement according to claim 1, further comprising a carrier substrate and a dielectric temperature compensation layer disposed on the carrier substrate, wherein the piezoelectric substrate is disposed on the dielectric temperature compensation layer.

11. The surface acoustic wave resonator arrangement according to claim 10, wherein the piezoelectric substrate is removed within the single trench to expose the dielectric temperature compensation layer.

12. The surface acoustic wave resonator arrangement according to claim 10, wherein the piezoelectric substrate and the dielectric temperature compensation layer are removed within the single trench.

13. The surface acoustic wave resonator arrangement according to claim 1, further comprising a plurality of surface acoustic wave resonators including the first surface acoustic wave resonator, the plurality of surface acoustic wave resonators forming a RF filter, the single trench disposed in vicinity to the plurality of surface acoustic wave resonators of the RF filter.

14. The surface acoustic wave resonator arrangement according to claim 1, further comprising a first plurality of surface acoustic wave resonators including the first surface acoustic wave resonator and a second plurality of surface acoustic wave resonators including the second surface acoustic wave resonator, the first plurality of surface acoustic wave resonators forming a first RF filter and the second plurality of surface acoustic wave resonators forming a second RF filter, the single trench disposed between the first plurality of surface acoustic wave resonators and the second plurality of surface acoustic wave resonators.

15. A communication device, comprising:
a signal processing unit;
an antenna to transmit and/or receive RF signals; and
a RF front-end unit coupled between the signal processing unit and the antenna,
wherein the RF front-end unit includes at least one RF filter and the at least one RF filter includes at least one surface acoustic wave resonator arrangement, and
wherein the at least one surface acoustic wave resonator arrangement includes:
 a first surface acoustic wave resonator including an interdigital transducer disposed on a piezoelectric substrate;
 a second acoustic wave resonator laterally adjacent to the surface acoustic wave resonator; and
 a single trench disposed within the piezoelectric substrate, the single trench facing the first surface acoustic wave resonator and slanted with respect to an edge of the surface acoustic wave resonator,
wherein the single trench comprises one or more trench portions, each trench portion extending along a direction that forms angles ($\alpha 1$, $\alpha 2$) with the edge of the first surface acoustic wave resonator.

* * * * *